US009467232B2

(12) United States Patent
Walewski

(10) Patent No.: US 9,467,232 B2
(45) Date of Patent: Oct. 11, 2016

(54) CODING SCHEME AND METHOD FOR A COLOUR-SHIFT-KEYING CONSTELLATION IN A VISIBLE-LIGHT COMMUNICATION SYSTEM

(75) Inventor: Joachim Walewski, Unterhaching (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 13/980,447

(22) PCT Filed: Sep. 19, 2011

(86) PCT No.: PCT/EP2011/066174
§ 371 (c)(1),
(2), (4) Date: Jul. 18, 2013

(87) PCT Pub. No.: WO2012/097885
PCT Pub. Date: Jul. 26, 2012

(65) Prior Publication Data
US 2013/0308955 A1    Nov. 21, 2013

(30) Foreign Application Priority Data
Jan. 18, 2011    (EP) .................................... 11151232

(51) Int. Cl.
*H04B 10/516* (2013.01)
*H03M 7/16* (2006.01)
*H04B 10/116* (2013.01)

(52) U.S. Cl.
CPC ............. *H04B 10/516* (2013.01); *H03M 7/16* (2013.01); *H04B 10/116* (2013.01)

(58) Field of Classification Search
CPC ........................................................ H03M 7/16
USPC ......................................................... 398/118
See application file for complete search history.

(56) References Cited

U.S. PATENT DOCUMENTS

| 2004/0008737 A1* | 1/2004 | McClellan | .......... | H03M 13/256 |
| | | | | 370/535 |
| 2012/0275796 A1* | 11/2012 | Yokoi | .................. | H04B 10/116 |
| | | | | 398/130 |
| 2012/0308229 A1* | 12/2012 | Bahr | .................... | H04B 10/116 |
| | | | | 398/25 |

FOREIGN PATENT DOCUMENTS

| EP | 1148651 A2 | 10/2001 | ............. G06F 11/10 |
| WO | WO 2010044635 A2 * | 4/2010 | ......... H04B 10/1149 |
| WO | 2012/097885 A1 | 7/2012 | ............ H03M 13/25 |

OTHER PUBLICATIONS

Atsuya Yokoi, Project: IEEE P802.15Working Group for Wireless Personal Area Networks (WPANs), I EEE 802.15 15-0247-00-0007, Mar. 16 2011.*
Sridhar Rajagopal, IEEE 802.15.7 Visible Light Communication: Modulation Schemes and Dimming Support,IEEE Communications Magazine, Mar. 2012.*

(Continued)

*Primary Examiner* — David Payne
*Assistant Examiner* — Omar S Ismail
(74) *Attorney, Agent, or Firm* — Slayden Grubert Beard PLLC

(57) ABSTRACT

A coding scheme for a color-shift-keying constellation in a visible-light communication system is provided, whereby a minimum number of flipped bits between symbols assigned to neighboring symbol points in the constellation is aimed. Improved assignments of symbol values to symbol points of the constellation may be provided, which may be capable of reducing a total Hamming distance between all symbol points in the constellation, thereby leading to a reduction of a bit-error ratio.

3 Claims, 5 Drawing Sheets

(56) References Cited

OTHER PUBLICATIONS

Atsuya Yokoi, Project: IEEE P802.15Working Group for Wireless Personal Area Networks (WPANs), I EEE 802.15 15-0247-00-0007, Mar. 16 2011 ).*

Park, Sung-Joon, "Bit Mapping of Triangular Quadrature Amplitude Modulation," IEEE International Symposium on Personal, Indoor and Mobile Radio Communications, PIMRC, 3 pages, Sep. 2007.

Son, Jaeseung et al., "Project: IEEE P802.15 Working Group for Wireless Personal Area Networks (WPANs): CSK Gray Coding," IEEE 802.15-10-0724-00-0007, 46 pages, Sep. 2010.

Anonymous, "IEEE 802.15.7 Draft D4: Part 15.7 PHY and MAC Standard for Short Range Wireless Optical Communication Using Visible Light," IEEE Standard, 296 pages, Nov. 14, 2010.

Yokoi, Atsuya, "Project: IEEE P802.15 Working Group for Wireless Personal Area Networks (WPANs): CSK Gray Coding," IEEE 802.15-11-0010-01-0007, 9 pages, Jan. 2011.

International Search Report and Written Opinion, Application No. PCT/EP2011/066174, 11 pages, Feb. 8, 2012.

Ding, De-qiang et al., "Visible Light Communication and Research on Its Key Techniques," Semiconduuctor Optoelectronics, vol. 27, No. 2, pp. 114-117 (6 pages total) (Chinese language w/ English abstract), Apr. 2006.

Chinese Office Action, Application No. 201180065390.5, 14 pages, Aug. 28, 2015.

Yokoi, Atsuya et al., "Project: IEEE P802.15 Working Group for Wireless Personal Area Networks (WPANs)," Samsung Electronics, 46 pages, Sep. 13, 2010.

European Summons to Attend Oral Proceedings, Application No. 11766913.5, 12 pages, Apr. 13, 2016.

IEEE Standard for Local and Metropolitan Area Networks—Part 15.7: Short-Range Wireless Optical Communication Using Visible Light; IEEE Std 802.15.Jul. 2011; IEEE; Piscataway; NJ, USA, pp. 1-309; XP017694867; ISBN: 978-0-7381-6665-0, 2011.

European Office Action, Application No. 11766913.5, 9 pages, Aug. 5, 2015.

* cited by examiner

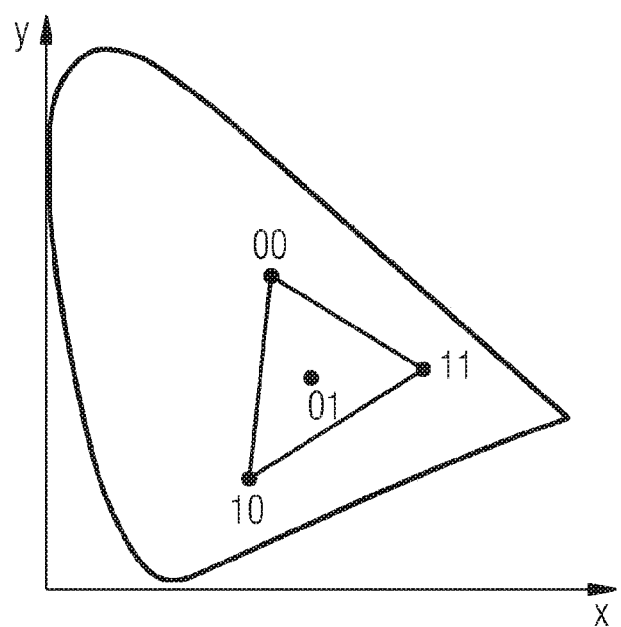
FIG 2  STATE OF THE ART

FIG 3  STATE OF THE ART
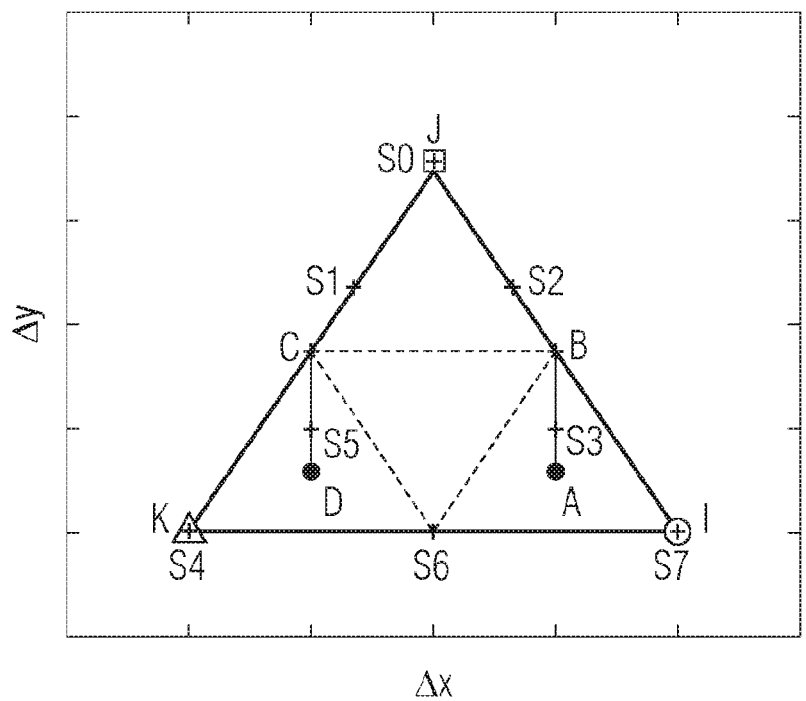
FIG 4  STATE OF THE ART
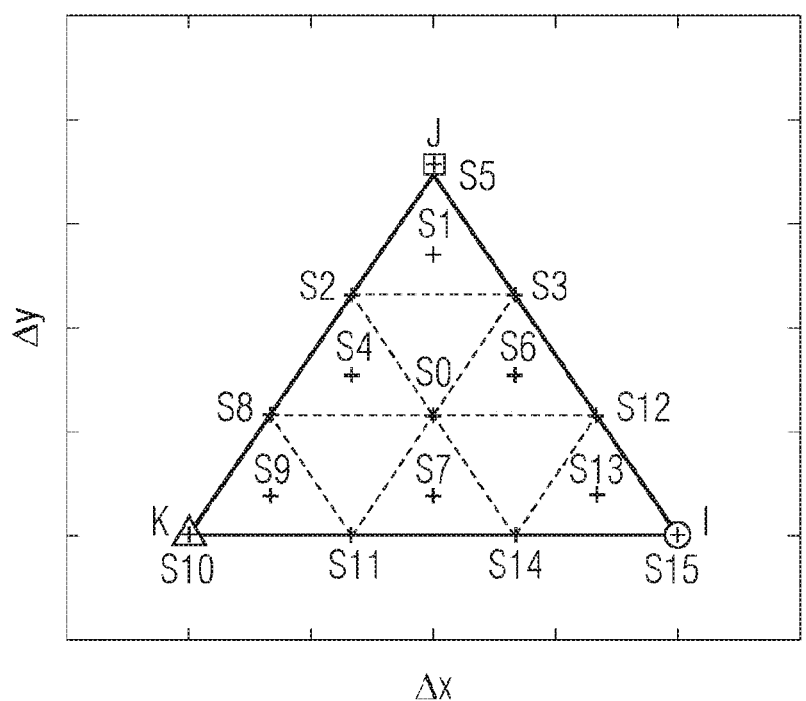

FIG 5    STATE OF THE ART
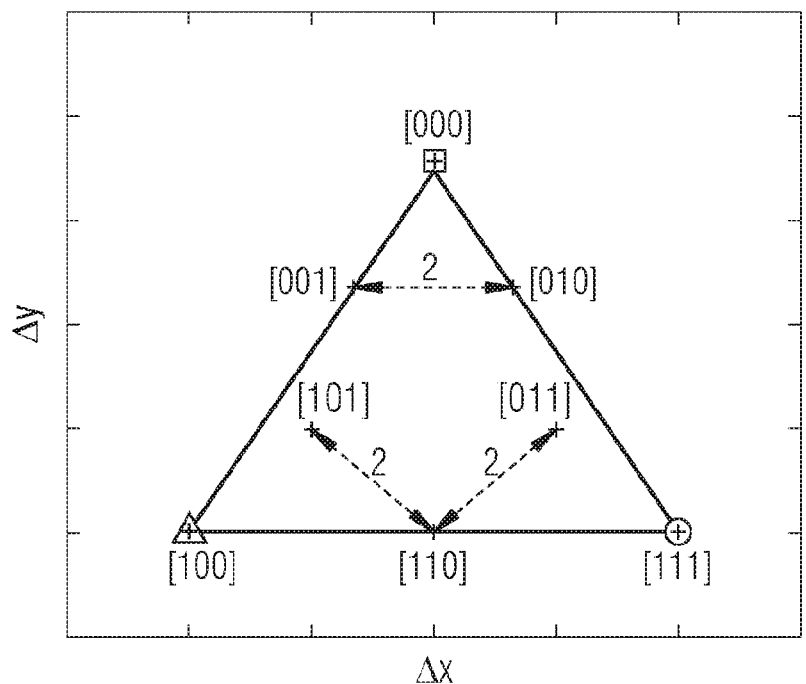
FIG 6    STATE OF THE ART
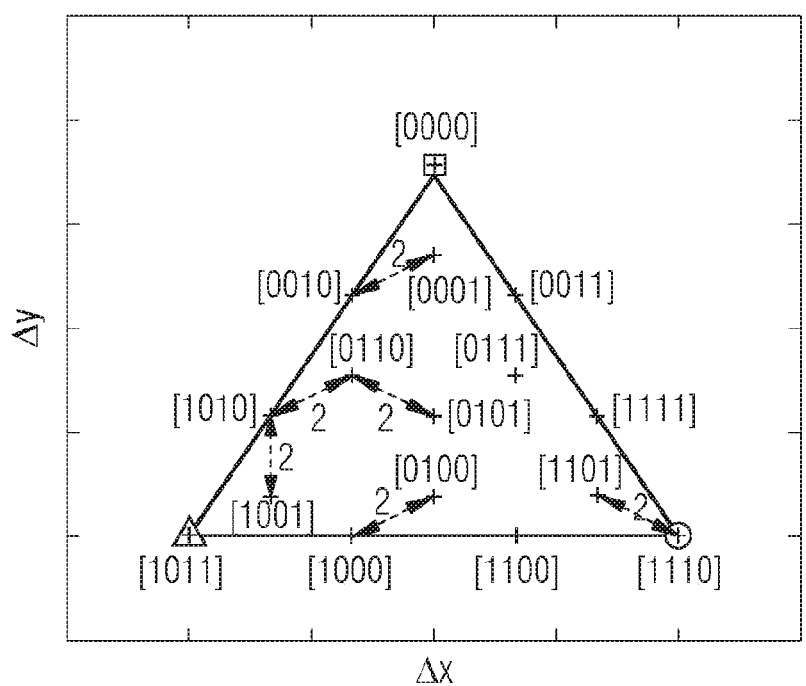

CODING SCHEME AND METHOD FOR A COLOUR-SHIFT-KEYING CONSTELLATION IN A VISIBLE-LIGHT COMMUNICATION SYSTEM

CROSS-REFERENCE TO RELATED APPLICATIONS

This application is a U.S. National Stage Application of International Application No. PCT/EP2011/066174 filed Sep. 19, 2011, which designates the United States of America, and claims priority to EP Patent Application No. 11151232.3 filed Jan. 18, 2011. The contents of which are hereby incorporated by reference in their entirety.

TECHNICAL FIELD

This disclosure relates to a coding scheme for a colour-shift-keying constellation in a visible-light communication system. Specifically, the disclosure relates to a coding scheme applicable in accordance with the specifications of IEEE 802.15.7.

BACKGROUND

In the field of indoor wireless networks, visible-light communications (VLC) is garnering increasing attention. One of the type of emitters used in this technology are light-emitting diodes, which can synergistically provide both illumination and data transmission.

One possible transmission mode for VLC is known as colour-shift keying (CSK). CSK supports visible-light communications using multi-colour light sources and photo detectors. The data to be transmitted is thereby encoded with mixed colours.

The IEEE 802.15.7 task group is currently working towards a global VLC standard, in which CSK coding is explicitly covered. According to a draft standard IEEE 802.15.7, a CSK signal is generated by using three colour light sources.

A CSK constellation is defined by a combination of three colour bands of the respective three colour light sources. The CSK constellation is operated in a triangle-shaped constellation diagram in x-y colour coordinates. The triangular shape stems from the fact that three emitters of different colour are use. Three vertices of the CSK constellation diagram are decided by the centre wavelength of the three colour bands in which the three emitters reside. How cases, in which the emitters lie in multiple bands, are decided is described in the current version of the IEEE 802.15.7 draft.

Within the CSK constellation, constellation points are defined. Constellation points, hereinafter also referred to as symbol points, latter symbol points being synonymous with constellation points, are defined by a design rule within draft standard IEEE 802.15.7.

By a data-mapping rule, which is also provided within draft standard IEEE 802.15.7, a unique binary symbol value is assigned to each constellation point in order to provide a coding scheme, by which a particular >>colour<<, i.e. a particular combination of the three colours, is assigned to a unique symbol value.

Applying this coding scheme, an optical transmitter is enabled to encode an optical signal by a stream of data, the optical signal being a combination of the three colours. Conversely, an optical receiver is enabled to decode the stream of data by a received optical signal by applying said coding scheme.

Although an assignment of a specific binary symbol value to a specific constellation point may be employed arbitrarily in a first approach, some assignments may exhibit advantages compared to other assignments.

If optical signals received by the receiver are obscured by noise, a wrong symbol might be decoded. In order to minimise the entailed bit errors one needs to minimise a number of flipped bits between symbols assigned to neighbouring constellation points.

Although the publication Yokoi, A: >>CSK Gray coding<<, IEEE 802, document #15-11-0010-01-007, 2011, has suggested an improved assignment of binary symbol values leading to a reduced number of flipped bits between symbols assigned to neighbouring constellation points, those suggested assignments are not yet optimal regarding the need in the art to achieve a minimum of said number of flipped bits between symbols assigned to neighbouring constellation points.

SUMMARY

One embodiment provides a coding scheme for a colour-shift-keying constellation in a visible-light communication system, the colour-shift-keying constellation including sixteen symbol points, S0-S15, the symbol points having a numbered order and location within the colour-shift-keying constellation according to IEEE 802.15.7 specifications, whereby each of the symbol points is assigned by a respective binary symbol value as follows:
S0 is assigned by a binary symbol value of 0110;
S1 is assigned by a binary symbol value of 0001;
S2 is assigned by a binary symbol value of 0011;
S3 is assigned by a binary symbol value of 0101;
S4 is assigned by a binary symbol value of 0010;
S5 is assigned by a binary symbol value of 0000;
S6 is assigned by a binary symbol value of 0111;
S7 is assigned by a binary symbol value of 1110;
S8 is assigned by a binary symbol value of 1010;
S9 is assigned by a binary symbol value of 1011;
S10 is assigned by a binary symbol value of 1001;
S11 is assigned by a binary symbol value of 1111;
S12 is assigned by a binary symbol value of 0100;
S13 is assigned by a binary symbol value of 1101;
S14 is assigned by a binary symbol value of 1100; and;
S15 is assigned by a binary symbol value of 1000;

Another embodiment provides a coding scheme for a colour-shift-keying constellation in a visible-light communication system, the colour-shift-keying constellation including eight symbol points S0-S7, the symbol points having a numbered order and location within the colour-shift-keying constellation according to IEEE 802.15.7 specifications, whereby each of the symbol points is assigned by a respective binary symbol value as follows:
S0 is assigned by a binary symbol value of 100;
S1 is assigned by a binary symbol value of 000;
S2 is assigned by a binary symbol value of 110;
S3 is assigned by a binary symbol value of 010;
S4 is assigned by a binary symbol value of 101;
S5 is assigned by a binary symbol value of 001;
S6 is assigned by a binary symbol value of 011; and;
S7 is assigned by a binary symbol value of 111.

Another embodiment provides a colour coding and/or decoding unit for coding data being transmitted by a colour-shift-keying transmission within a visible-light communication system, the colour coding and/or decoding unit comprising one of the coding schemes disclosed above.

Another embodiment provides a method for transmitting data by colour-shift-keying transmission within a visible-light communication system, the method comprising a comprising one of the coding schemes disclosed above. Another embodiment provides a computer program product, the computer program product containing a program code stored on a non-transitory computer-readable medium and which, when executed on a computer, carries out such a method. Another embodiment provides a data storage carrier that stores such a computer program product.

BRIEF DESCRIPTION OF THE DRAWINGS

Example embodiment are discussed below with reference to the drawings, in which:

FIG. 2 shows a known chromaticity diagram including a known 4-CSK constellation;

FIG. 3 shows a known definition of eight constellation points for an 8-CSK constellation;

FIG. 4 shows a known definition of sixteen constellation points for a 16-CSK constellation;

FIG. 5 shows a known coding scheme, by which a respective binary symbol value consisting of three bits is assigned to each out of eight respective constellation points within an 8-CSK constellation;

FIG. 6 shows a known coding scheme, by which a respective binary symbol value consisting of four bits is assigned to each out of sixteen respective constellation points within a 16-CSK constellation;

DETAILED DESCRIPTION

Figure 1:
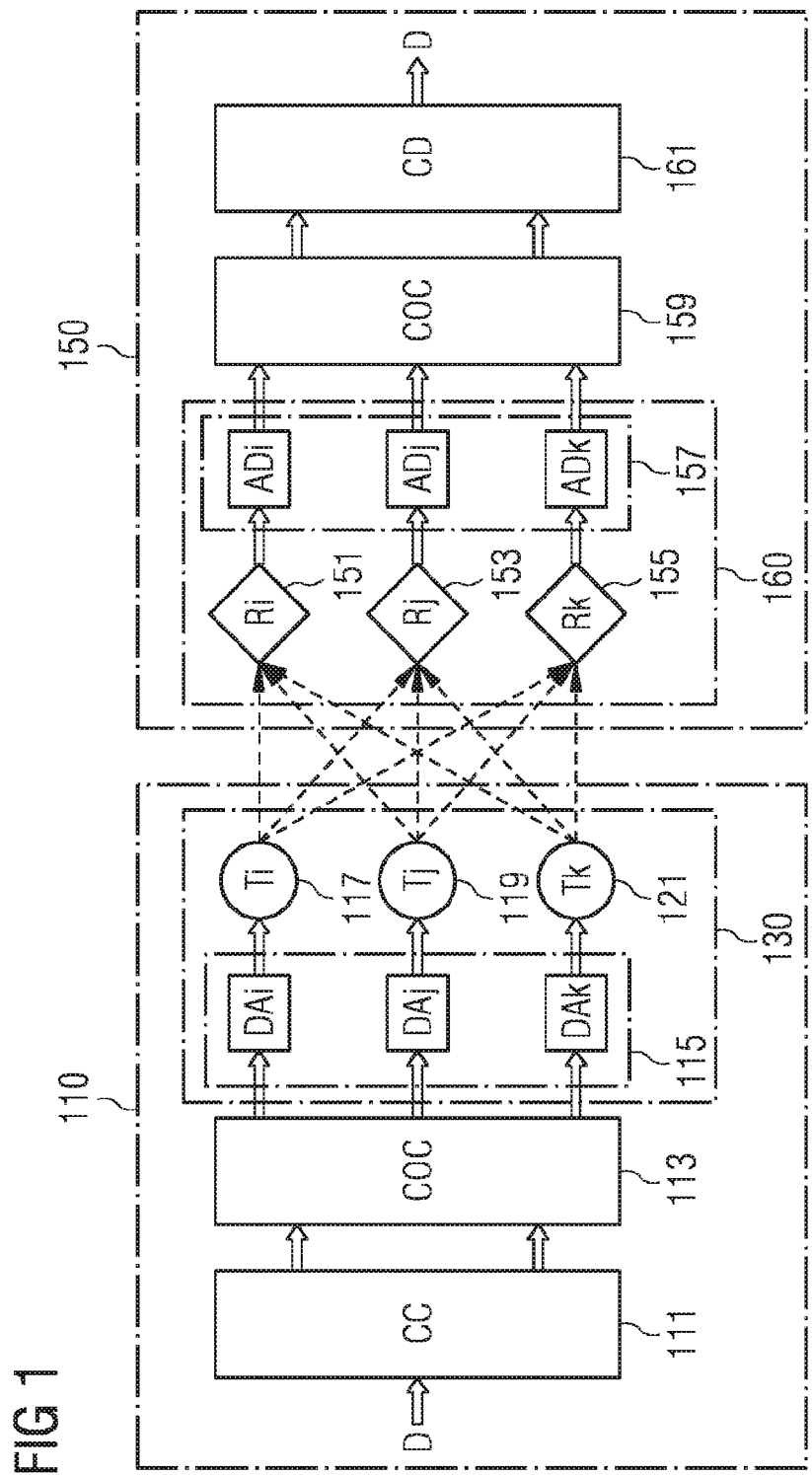
FIG. 1 shows a visible-light communication system according to one embodiment of the present invention.

Embodiments of the present disclosure provide a coding scheme with a minimum number of flipped bits between symbols assigned to neighbouring constellation points in a CSK constellation.

Other embodiments provide a coding scheme with a reduced error ratio when using visible-light communication.

According to one embodiment a coding scheme for a colour-shift-keying constellation in a visible-light communication system is provided, the colour-shift-keying constellation including sixteen symbol points, the symbol points having a numbered order and location within the colour-shift-keying constellation according to IEEE 802.15.7 specifications, whereby each of the symbol points is assigned by a respective binary symbol value as follows:

S0 is assigned by a binary symbol value of 0110;
S1 is assigned by a binary symbol value of 0001;
S2 is assigned by a binary symbol value of 0011;
S3 is assigned by a binary symbol value of 0101;
S4 is assigned by a binary symbol value of 0010;
S5 is assigned by a binary symbol value of 0000;
S6 is assigned by a binary symbol value of 0111;
S7 is assigned by a binary symbol value of 1110;
S8 is assigned by a binary symbol value of 1010;
S9 is assigned by a binary symbol value of 1011;
S10 is assigned by a binary symbol value of 1001;
S11 is assigned by a binary symbol value of 1111;
S12 is assigned by a binary symbol value of 0100;
S13 is assigned by a binary symbol value of 1101;
S14 is assigned by a binary symbol value of 1100; and;
S15 is assigned by a binary symbol value of 1000;

According to a second embodiment a coding scheme for a colour-shift-keying constellation in a visible-light communication system is provided, the colour-shift-keying constellation including eight symbol points, the symbol points having a numbered order and location within the colour-shift-keying constellation according to IEEE 802.15.7 specifications, whereby each of the symbol points is assigned by a respective binary symbol value as follows:

S0 is assigned by a binary symbol value of 100;
S1 is assigned by a binary symbol value of 000;
S2 is assigned by a binary symbol value of 110;
S3 is assigned by a binary symbol value of 010;
S4 is assigned by a binary symbol value of 101;
S5 is assigned by a binary symbol value of 001;
S6 is assigned by a binary symbol value of 011; and;
S7 is assigned by a binary symbol value of 111.

According to one embodiment, a colour coding and/or decoding unit for coding data being transmitted by a colour-shift-keying transmission within a visible-light communication system is provided, the colour coding and/or decoding unit comprising a coding scheme according to one of the aforementioned claims. According to a first alternative of said embodiment, the colour coding and decoding is performed by an identical coding and decoding unit, which is adaptable of either performing the coding or decoding. According to a second alternative of said embodiment, the colour coding unit is substantially different from a colour decoding unit, whereby both, the coding unit and the decoding unit have the commonality of comprising a coding scheme according to an aforementioned embodiment.

According to one embodiment, a method for transmitting data by a colour-shift-keying transmission within a visible-light communication system is provided, the method comprising a coding scheme according to an aforementioned embodiment. According to one embodiment, a computer program product is provided, which contains a program code stored on a computer-readable medium and which, when executed on a computer, carries out a method according to an aforementioned embodiment.

According to one embodiment, a data storage carrier is provided which stores a computer program to cause a computer to perform a method according to an aforementioned embodiment.

One Embodiment One Embodiment

Reference will now be made in detail to example embodiments of the present invention, examples of which are illustrated in the accompanying drawings.

FIG. 1 is generally illustrating a visible-light communication system according to one embodiment.

Referring to FIG. 1, the visible-light communication system includes a visible-light transmission apparatus 110 and a visible-light reception apparatus 150.

The visible-light transmission apparatus 110 includes a colour-coding unit 111, a coordinates calculator 113, and a light-emitting unit 130.

The colour coding unit 111 of the visible-light transmission apparatus 110 codes the input data into x-y colour-coordinate values. That is, the stream of input data is segmented into data blocks of a given bit length which are mapped to a symbol. The process of mapping means that a symbol is selected within a colour constellation, the symbol having identical bits with the data block. Each symbol is assigned to a unique point in the constellation, which is also referred to as constellation point, or, synonymously, symbol point. The x-y colour-coordinate value of the symbol point, to which the symbol is assigned, is then outputted by the colour coding unit 111.

The coordinates calculator 113 calculates a triple of intensity values for three elementary colours—hereinafter exemplarily assumed to be red, green, blue—out of the x-y colour-coordinate value and transfers the triple of intensity values to the D/A convertor 115. The calculation of the triple of intensity values out of the duple of x-y colour coordinates is based on a relationship according to CIE1931 specifications for the RGB colour space.

The light-emitting unit 130 includes the D/A convertor 115, a red light-emitting diode 117, a green light-emitting diode 119, and a blue light-emitting diode 121 and emits a visible optical signal composed by the individual intensity values. That is, the D/A convertor 115 converts the triple of digital intensity values received from the coordinates calculator 113 into a triple of analogue intensity values.

The red light-emitting diode 117, the green light-emitting diode 119 and the blue light-emitting diode 121 emit the visible optical signal according to the converted analogue signal.

The visible-light reception apparatus 150 includes a detector unit 160, a coordinates calculator 159, and a colour decoding unit 161.

The detector unit 160 includes a photo detector 151 susceptible to red, a photo detector 153 susceptible to green, a photo detector 155 susceptible to blue and a D/A convertor 157.

The detector unit 160 converts the visible optical signal received from the visible-light transmission apparatus 110 into an electric signal. That is, the detector unit 160 converts the visible optical signal transmitted from the red light-emitting diode 117, the green light-emitting diode 119 and the blue light-emitting diode 121 into a triple of analogue electrical signals being a triple of analogue intensity values.

The A/D convertor 157 converts the triple of analogue intensity values for the electric signal into a triple of digital intensity values and transfers the triple of digital intensity values to the coordinates calculator 159.

The coordinates calculator 159 calculates the x-y colour-coordinate value for each triple of digital intensity values. Again, calculation of the x-y colour coordinates is based on a relationship according to CIE1931 specifications for the RGB colour space.

Finally, the colour decoding unit 161 decodes the x-y colour coordinates into a segmented data block. That is, the colour decoding unit 161 identifies a point in the colour constellation which is determined by the x-y colour-coordinate value. A symbol point of the colour constellation which is congruent or nearly congruent to said identified point is mapped. The symbol assigned to said mapped symbol point is determined. This symbol conforms to the segmented data block. A plurality of segmented data blocks are converted into a stream of data.

The colour coding unit 111 and the colour decoding unit 161 are adapted to a coding according to one of the disclosed embodiments. Particularly, symbols assigned to symbol points are determined by a coding scheme according to one of the embodiments described hereinafter.

FIG. 2 shows a triangle-shaped constellation diagram (>>constellation triangle<<) within a horseshoe-shaped chromaticity diagram. The constellation defines a coding scheme capable of coding four information symbols by four constellation points, or, synonymously, symbol points in a visible-light communication system. Accordingly, this constellation is entitled as 4-CSK constellation (>>colour-shift keying<<). CSK assumes visible-light communication systems which include multi colour light sources and photo detectors.

By means of the chromaticity diagram, all visible colours in the colour palette are defined by x-y colour coordinate values.

The CSK signal is generated by using 3 colour light sources out of the 7 colour bands that are defined by the table below

| Band (nm) | centre wavelength (nm) | x-y colour coordinates |
|---|---|---|
| 380-478 | 429 | (0.169, 0.007) |
| 478-540 | 509 | (0.011, 0.733) |
| 540-588 | 564 | (0.402, 0.597) |
| 588-633 | 611 | (0.669, 0.331) |
| 633-679 | 656 | (0.729, 0.271) |
| 679-726 | 703 | (0.734, 0.265) |
| 726-780 | 753 | (0.734, 0.265) |

The three vertices of a CSK constellation triangle are decided by the centre wavelength of the 3 colour bands on x-y colour coordinates.

Implementers of CSK systems can select the colour band based on the centre wavelength of the actual optical source. The table above shows the x-y colour coordinate values assuming the optical source is chosen with the spectral peak occurring at the centre of each of the 7 colour bands.

In the case of FIG. 2, four constellation points are positioned in a triangle including a constellation point in the centre of said triangle, which is the centre wavelength specified above. This centre is also referred to as >>centre of gravity<< of a respective constellation. By using this 4-CSK constellation 2 bits of data information may be transmitted per symbol.

Each constellation point is assigned by a binary symbol value which determines the symbol associated with a specific constellation point. In the example of FIG. 2, the centre point of the triangle is being assigned by a symbol having a binary value of 01, the upper vertex being assigned by a symbol having a binary value of 00, the lower vertex being assigned by a symbol having a binary value of 10, the right vertex being assigned by a symbol having a binary value of 11.

The value of the two-dimensional x-y colour coordinates may be transformed into a triple of colour-intensity values and vice versa. Each of the three values within the triple represents an intensity of a respective elementary colour, e.g. red, green, and blue. The relationship between x and y and the intensity values for the colours red, green and blue (R,G,B) within said triple is defined according to the CIE1931 specifications for the RGB colour space and determined by the following equations:

$X=2.7689R+1.7518G+1.1302B$ $Y=1.0000R+4.5907G+0.0601B$ $Z=0.0565G+5.5943B$ $x=X/(X+Y+Z)$ $y=Y/(X+Y+Z)$ $1=X+Y+Z$

Concerning the determination of the symbol assigned to a specific constellation point, some assignments have proofed more advantageous than other assignment. An advantageous assignment is based on the following considerations.

If optical signals received by the light-reception apparatus are obscured by noise, a wrong symbol might be decoded. In order to minimise the entailed bit errors one needs to minimise a number of flipped bits between symbols assigned to neighbouring constellation points. The number of flipped bits is hereinafter referred to as Hamming distance between symbols. The goal of minimising a number of flipped bits between symbols assigned to neighbouring constellation points is achieved by carefully choosing a symbol assigned to each constellation point within the constellation. This is done by applying the principles of Gray coding.

Referring to a constellation, a Gray code can be defined as a code for assigning to each constellation point a binary symbol consisting of a plurality of bits, such that symbols of every pair of adjacent constellation points differ by a minimum of bits. In other words, one strives to reduce all Hamming distances to a minimum, ideally one.

More generally, the >>ideal<< Gray code, wherein two adjacent symbols differ by only one bit, can be referred to as a single-distance code, reflecting a Hamming distance of one between adjacent codes.

However, this >>ideal<< Gray code having a Hamming distance of one for all adjacent constellation points cannot be realized for all constellation points in the case of a given triangular constellation.

The goal is rather achieved by choosing an assignment wherein the total count of Hamming distances between all neighbouring constellation points, or, synonymously, symbol points is minimal.

As to the specific symbol assignment shown for the 4-CSK constellation according to FIG. 2, the Hamming distance between adjacent constellation points is one for four pairs of constellation points, namely 00-01, 01-11, 11-10 and 10-00. There are two pairs having a Hamming distance of two, namely 10-01 and 00-11.

Hereinafter, a coding scheme is understood as a scheme of assigning a specific binary symbol to each constellation point, or, synonymously, symbol point of a given constellation. Both synonymous terms denote defined points in a constellation of a given numbered order, whereby the location and numbered order of each point is defined by a rule illustrated by FIGS. 3 and 4. Whereas the term >>symbol point<< is preferred in the standard, the term >>constellation point<< is widely used herein, in order to point out the topological character within a constellation, but also to differentiate a constellation point by the symbol assigned to the constellation point.

The symbol assignment in a 4-CSK constellation according to FIG. 2 has already been considered as being the assignment with the least possible total Hamming distance. Said total Hamming distance is calculated by adding up each Hamming distance value of all closely spaced adjacent pairs of constellation points. For example, the pair 00-10 is not considered for this analysis.

Embodiments of the present invention relate to coding schemes for constellations of a higher order than shown for the case of a 4-CSK constellation shown in FIG. 2.

In the following FIGS. 3 and 4, a general definition of the numbered order and location of constellation points is shown for an 8-CSK and a 16-CSK constellation, respectively.

In the interests of clarity and by contrast to the representation of FIG. 2, the constellation diagrams in FIGS. 3 and 4 are shown without a chromaticity diagram. Further more, the x-y colour coordinates shown in FIG. 2 are standardized to differential quantities Δx and Δy in FIGS. 3 and 4.

The definition of constellation points, or, synonymously, symbol points for an 8-CSK constellation according to FIG. 3, refers to the CSK constellation design rules for 8-CSK outlined in draft standard IEEE P802.15.7.

The definition of constellation points, or, synonymously, symbol points for a 16-CSK constellation according to FIG. 4, refers to the CSK constellation design rules for 16-CSK outlined in draft standard IEEE P802.15.7.

Turning now to FIG. 3, eight constellation points (or, >>symbol points<<) S0,S1,S2,S3,S4,S5,S6,S7 are defined as shown.

Points I,J,K are located in the centre of the three colour bands on x-y colour coordinates, respectively (see the above table). Constellation points S0, S4 and S7 are 3 vertices of the triangle IJK;

Constellation points S1 and S2 are points that divide side JK and side JI in a ratio of 1:2;

Points B and C are midpoints of the line JI and line JK;

Constellation point S6 is a midpoint of the line KI.

Point A is the centroid of the triangle B-S6-I.

Point D is the centroid of the triangle C-K-S6.

Constellation point S3 is a point that divides line AB in the ratio 1:2.

Constellation point S5 is a point that divides line DC in the ratio 1:2.

Turning now to FIG. 4, sixteen constellation points (or, >>symbol points<<) S0,S1,S2,S3,S4,S5,S6,S7,S8,S9, S10,S11,S12, S13,S14,S15 are defined as shown.

Points I,J,K are located in the centre of the three colour bands on x-y colour coordinates, respectively (see the above table). Constellation points S5, S10 and S15 are 3 vertices of the triangle IJK;

Constellation points S2 and S8 are points that divide side JK in one third;

Constellation points S3 and S12 are points that divide side JI in one third;

Constellation points S11 and S14 are points that divide side KI in one third;

Constellation point S0 is the centroid or >>centre of gravity<< of the triangle IJK;

Constellation points S1, S4, S6, S7, S9 and S13 are the centroids of each of the smaller triangles, namely:

Constellation point S1 is the centroid of the triangle S3-S5-S2;

Constellation point S4 is the centroid of the triangle S0-S2-S8;

Constellation point S6 is the centroid of the triangle S12-S3-S0;

Constellation point S7 is the centroid of the triangle S14-S0-S11;

Constellation point S9 is the centroid of the triangle S11-S8-S10; and;

Constellation point S13 is the centroid of the triangle S15-S12-S14.

After generally defining the numbered order and location of constellation points within an 8-CSK and a 16-CSK constellation, the following section describes a respective known symbol assignment which was suggested for amending draft standard IEEE P802.15.7. Again, symbol assignment follows the aim of assigning a binary symbol value to each constellation point.

FIG. 5 shows a known 8-CSK coding scheme by which a respective binary symbol value consisting of three bits is assigned to each out of eight respective constellation points S0,S1,S2,S3,S4,S5,S6,S7.

Thereby,

S0 is assigned by a binary symbol value of 000;
S1 is assigned by a binary symbol value of 001;
S2 is assigned by a binary symbol value of 010;
S3 is assigned by a binary symbol value of 011;
S4 is assigned by a binary symbol value of 100;
S5 is assigned by a binary symbol value of 101;
S6 is assigned by a binary symbol value of 110; and;
S7 is assigned by a binary symbol value of 111.

As to the symbol assignment in an 8-CSK constellation according to FIG. 5, the Hamming distance between the symbols of adjacent constellation points is one for nearly all pairs of adjacent constellation points, except of three pairs having a Hamming distance of two, namely for the following pairs of adjacent constellation points:

S1-S2 or, in terms of assigned binary symbols 001-010;
S3-S6 or, in terms of assigned binary symbols 011-110; and;
S5-S6 or, in terms of assigned binary symbols 101-110.

In summary, the currently applied 8-CSK coding scheme includes three pairs of adjacent constellation points having a Hamming distance of two.

The total Hamming distance is calculated by adding up individual Hamming distance values of all adjacent pairs of constellation points. The total Hamming distance of the coding scheme in an 8-CSK constellation according to the currently applied 8-CSK coding scheme is 12.

FIG. 6 shows a currently applied 16-CSK coding scheme by which a respective binary symbol value consisting of four bits is assigned to each out of sixteen respective constellation points S0,S1,S2,S3,S4,S5,S6,S7,S8,S9,S10,S11,S12,S13,S14,S15.

Thereby,

S0 is assigned by a binary symbol value of 0101;
S1 is assigned by a binary symbol value of 0001;
S2 is assigned by a binary symbol value of 0010;
S3 is assigned by a binary symbol value of 0011;
S4 is assigned by a binary symbol value of 0110;
S5 is assigned by a binary symbol value of 0000;
S6 is assigned by a binary symbol value of 0111;
S7 is assigned by a binary symbol value of 0100;
S8 is assigned by a binary symbol value of 1010;
S9 is assigned by a binary symbol value of 1001;
S10 is assigned by a binary symbol value of 1011;
S11 is assigned by a binary symbol value of 1000;
S12 is assigned by a binary symbol value of 1111;
S13 is assigned by a binary symbol value of 1101;
S14 is assigned by a binary symbol value of 1100; and;
S15 is assigned by a binary symbol value of 1110;

As to the symbol assignment in an 16-CSK constellation according to FIG. 6, the Hamming distance between the symbols of adjacent constellation points is one for all pairs of adjacent constellation points, except of six pairs having a Hamming distance of two, namely for the following pairs of adjacent constellation points:

S1-S2 or, in terms of assigned binary symbols 0001-0010;
S0-S4 or, in terms of assigned binary symbols 0101-0110;
S4-S8 or, in terms of assigned binary symbols 0110-1010;
S7-S11 or, in terms of assigned binary symbols 0100-1000;
S8-S9 or, in terms of assigned binary symbols 1010-1001; and;
S13-S15 or, in terms of assigned binary symbols 1101-1110.

In summary, the currently applied 16-CSK coding scheme includes six pairs of adjacent constellation points having a Hamming distance of two.

The total Hamming distance is calculated by adding up individual Hamming distance values of all adjacent pairs of constellation points. The total Hamming distance of the coding scheme in a 16-CSK constellation according to the currently applied 16-CSK coding scheme is 24.

The following section describes improved symbol assignments according to several embodiments.

Figure 7:
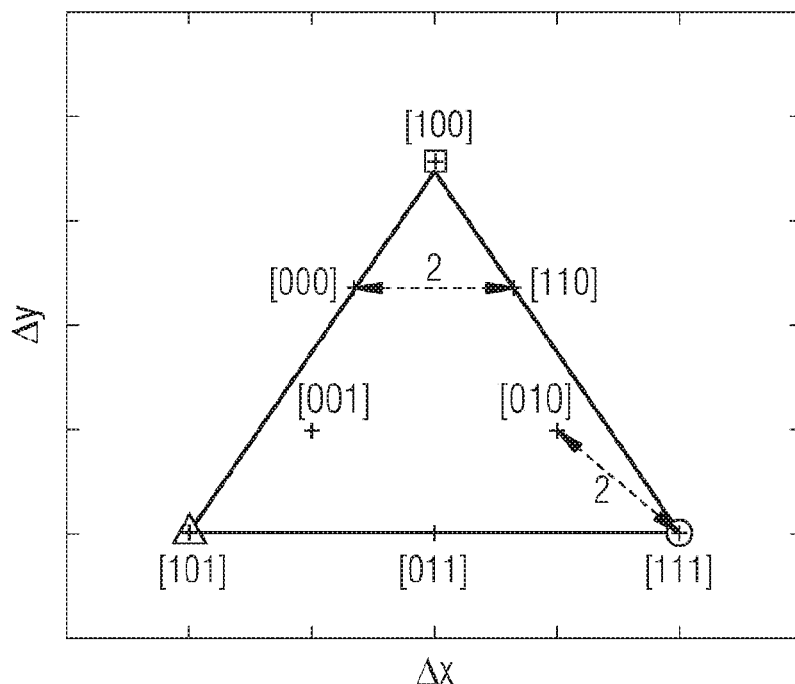
FIG. 7 shows a coding scheme according to one embodiment within an 8-CSK constellation.

FIG. 7 shows an 8-CSK coding scheme according to one embodiment. A respective symbol consisting of three bits is assigned to each of a respective constellation point S0,S1, S2,S3,S4,S5,S6,S7.

Thereby,

S0 is assigned by a binary symbol value of 100;
S1 is assigned by a binary symbol value of 000;
S2 is assigned by a binary symbol value of 110;
S3 is assigned by a binary symbol value of 010;
S4 is assigned by a binary symbol value of 101;
S5 is assigned by a binary symbol value of 001;
S6 is assigned by a binary symbol value of 011; and;
S7 is assigned by a binary symbol value of 111.

As to the symbol assignment in an 8-CSK constellation according to FIG. 7, the Hamming distance between the symbols of adjacent constellation points is one for nearly all pairs of adjacent constellation points, except of two pairs having a Hamming distance of two, namely for the following pairs of adjacent constellation points:

S1-S2 or, in terms of assigned binary symbols 000-110; and;
S3-S7 or, in terms of assigned binary symbols 010-111.

In summary, the 8-CSK coding scheme according to one embodiment includes two pairs of adjacent constellation points having a Hamming distance of two.

The total Hamming distance of the symbol assignment in an 8-CSK constellation according to one embodiment is 11.

The total Hamming distance of the coding scheme in an 8-CSK constellation according to one embodiment shown in FIG. 7 is advantageously below the known 8-CSK data coding scheme in FIG. 5.

The reduction of the total Hamming distance from 12 to 11 leads to an approximate reduction in the bit-error ratio by a factor of 8%. This factor is calculated by (12−11)/12.

A further advantage of this 8-CSK coding scheme according to one embodiment is that the pairs of constellation points having a Hamming distance of two are located on upper and right areas of the constellation. These areas correspond to longer wavelengths. Since the sensitivity of the photodetectors is usually larger for these longer wavelengths, and since the noise in the channel often is wavelength-independent, this implies that the SNR of these constellation points usually is larger than that of others, and symbol errors do thus occur at a lower frequency for these constellation points. It is therefore advantageous—in terms of minimizing the bit-error ratio—to place constellations with large Hamming distances in this part of the constellation diagram.

Figure 8:
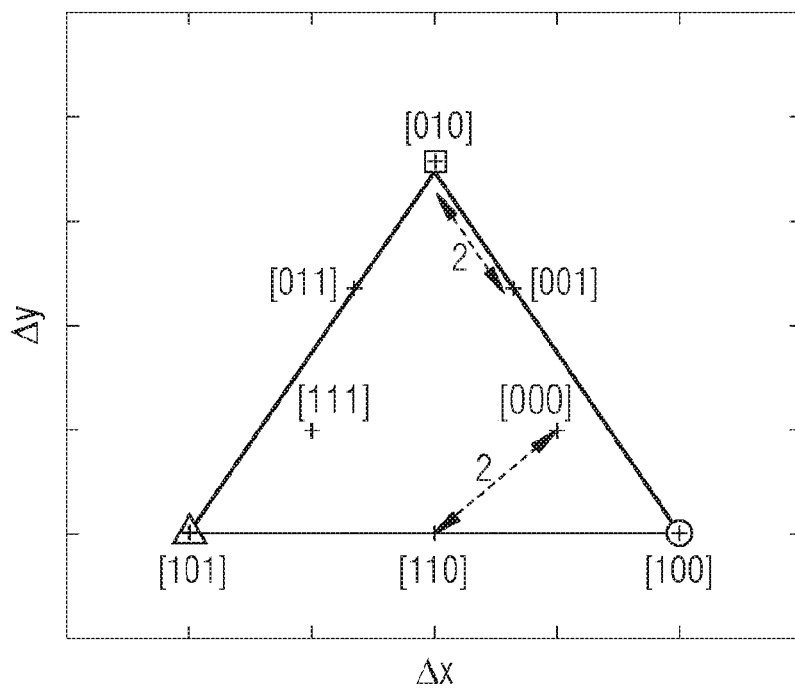
FIG. 8 shows a coding scheme according to one embodiment within a 16-CSK constellation.

FIG. 8 shows a 16-CSK coding scheme according to one embodiment. A respective symbol consisting of four bits is assigned to each of a respective constellation point S0,S1, S2,S3,S4,S5,S6,S7,S8,S9,S10,S11,S12,S13,S14, S15.

Thereby,

S0 is assigned by a binary symbol value of 0110;
S1 is assigned by a binary symbol value of 0001;
S2 is assigned by a binary symbol value of 0011;
S3 is assigned by a binary symbol value of 0101;
S4 is assigned by a binary symbol value of 0010;
S5 is assigned by a binary symbol value of 0000;
S6 is assigned by a binary symbol value of 0111;

S7 is assigned by a binary symbol value of 1110;
S8 is assigned by a binary symbol value of 1010;
S9 is assigned by a binary symbol value of 1011;
S10 is assigned by a binary symbol value of 1001;
S11 is assigned by a binary symbol value of 1111;
S12 is assigned by a binary symbol value of 0100;
S13 is assigned by a binary symbol value of 1101;
S14 is assigned by a binary symbol value of 1100; and;
S15 is assigned by a binary symbol value of 1000;

As to the symbol assignment in an 16-CSK constellation according to FIG. 8, the Hamming distance between the symbols of adjacent constellation points is one all for all pairs of adjacent constellation points, except of three pairs having a Hamming distance of two, namely for the following pairs of adjacent constellation points:

S6-S12 or, in terms of assigned binary symbols 0111-0100;

S12-S13 or, in terms of assigned binary symbols 0100-1101; and;

S13-S15 or, in terms of assigned binary symbols 1101-1000.

In summary, the 16-CSK coding scheme according to one embodiment includes three pairs of adjacent constellation points having a Hamming distance of two.

The total Hamming distance of the coding scheme in a 16-CSK constellation according to the preferred embodiment of the invention is 21.

The reduction of the total Hamming distance from 24 to 21 leads to an approximate reduction in the bit-error ratio by a factor of 13%. This factor is calculated by (24−21)/24.

A further advantage of this 16-CSK coding scheme according to one embodiment is that the pairs of constellation points having a Hamming distance of two are located on upper and right areas of the constellation. These areas correspond to longer wavelengths. Since the sensitivity of the photodetectors is usually larger for these longer wavelengths, and since the noise in the channel often is wavelength-independent, this implies that the SNR of these constellation points usually is larger than that of others, and symbol errors do thus occur at a lower frequency for these constellation points. It is therefore advantageous—in terms of minimizing the bit-error ratio—to place constellations with large Hamming distances in this part of the constellation diagram.

In summary, at least some embodiments of the invention lead to improved assignments of symbol values to symbol points of the constellation which are advantageously capable of reducing a total Hamming distance between all symbol points in the constellation, thereby leading to a reduction of a bit-error ratio by a considerable amount.

At least some embodiments are implemented in computing hardware (computing apparatus) and/or software, including but not limited to any computer that can store, retrieve, process and/or output data and/or communicate with other computers.

The processes can also be distributed via, for example, downloading over a network such as the Internet. A program/software implementing the embodiments may be recorded on computer-readable media comprising computer-readable recording media.

The program/software implementing the embodiments may also be transmitted over a transmission communication media such as a carrier wave.

Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT).

Examples of the optical disk include a DVD (Digital Versatile Disc), a DVD-RAM, a CD-ROM (Compact Disc-Read Only Memory), and a CD-R (Recordable)/RW.

The invention has been described in detail with particular reference to example embodiments thereof, but it will be understood that variations and modifications can be effected within the spirit and scope of the invention covered by the claims.

What is claimed is:

1. A colour coding and/or decoding unit, comprising:
an optical transmitter configured to implement a coding scheme for a colour-shift-keying constellation in a visible-light communication system,
wherein the colour-shift-keying constellation includes sixteen symbol points, S0-S15,
wherein the symbol points have a numbered order and location within the colour-shift-keying constellation according to IEEE 802.15.7 specifications, and
wherein each of the symbol points is assigned by a respective binary symbol value as follows:
S0 is assigned by a binary symbol value of 0110;
S1 is assigned by a binary symbol value of 0001;
S2 is assigned by a binary symbol value of 0011;
S3 is assigned by a binary symbol value of 0101;
S4 is assigned by a binary symbol value of 0010;
S5 is assigned by a binary symbol value of 0000;
S6 is assigned by a binary symbol value of 0111;
S7 is assigned by a binary symbol value of 1110;
S8 is assigned by a binary symbol value of 1010;
S9 is assigned by a binary symbol value of 1011;
S10 is assigned by a binary symbol value of 1001;
S11 is assigned by a binary symbol value of 1111;
S12 is assigned by a binary symbol value of 0100;
S13 is assigned by a binary symbol value of 1101;
S14 is assigned by a binary symbol value of 1100; and
S15 is assigned by a binary symbol value of 1000; and
wherein pairs (S6-S12, S12-S13, S13-S15) of symbol points having a Hamming distance of two are located on upper and right arms of the colour-shift-keying constellation.

2. A colour coding and/or decoding unit, comprising:
an optical transmitter configured to implement a coding scheme coding scheme for a colour-shift-keying constellation in a visible-light communication system,
wherein the colour-shift-keying constellation includes eight symbol points, S0-S7,
wherein the symbol points have a numbered order and location within the colour-shift-keying constellation according to IEEE 802.15.7 specifications, and
wherein each of the symbol points is assigned by a respective binary symbol value as follows:
S0 is assigned by a binary symbol value of 100;
S1 is assigned by a binary symbol value of 000;
S2 is assigned by a binary symbol value of 110;
S3 is assigned by a binary symbol value of 010;
S4 is assigned by a binary symbol value of 101;
S5 is assigned by a binary symbol value of 001;
S6 is assigned by a binary symbol value of 011; and
S7 is assigned by a binary symbol value of 111; and
wherein pairs (S1-S2, S3-S7) of symbol points having a Hamming distance of two are located on upper and right arms of the colour-shift-keying constellation.

3. A method for transmitting data by colour-shift-keying transmission within a visible-light communication system, the method comprising:

using an optical transmitter to implement a coding scheme coding scheme for the colour-shift-keying constellation in the visible-light communication system, wherein the colour-shift-keying constellation includes sixteen symbol points, S0-S15, wherein the symbol points have a numbered order and location within the colour-shift-keying constellation according to IEEE 802.15.7 specifications, and wherein each of the symbol points is assigned by a respective binary symbol value as follows:

S0 is assigned by a binary symbol value of 0110;
S1 is assigned by a binary symbol value of 0001;
S2 is assigned by a binary symbol value of 0011;
S3 is assigned by a binary symbol value of 0101;
S4 is assigned by a binary symbol value of 0010;
S5 is assigned by a binary symbol value of 0000;
S6 is assigned by a binary symbol value of 0111;
S7 is assigned by a binary symbol value of 1110;
S8 is assigned by a binary symbol value of 1010;
S9 is assigned by a binary symbol value of 1011;
S10 is assigned by a binary symbol value of 1001;
S11 is assigned by a binary symbol value of 1111;
S12 is assigned by a binary symbol value of 0100;
S13 is assigned by a binary symbol value of 1101;
S14 is assigned by a binary symbol value of 1100; and
S15 is assigned by a binary symbol value of 1000; and wherein pairs (S6-S12, S12-S13, S13-S15) of symbol points having a Hamming distance of two are located on upper and right arms of the colour-shift-keying constellation.

* * * * *